United States Patent
Ohmi et al.

(10) Patent No.: US 7,141,756 B2
(45) Date of Patent: Nov. 28, 2006

(54) MICROWAVE PLASMA PROCESSING APPARATUS, PLASMA IGNITION METHOD, PLASMA FORMING METHOD, AND PLASMA PROCESSING METHOD

(75) Inventors: Tadahiro Ohmi, 1-17-301, Komegafukuro 2-Chome, Aoba-Ku, Sendai-Shi, Miyagi (JP) 980-0813; Masaki Hirayama, Sendai (JP); Shigetoshi Sugawa, Sendai (JP); Tetsuya Goto, Sendai (JP)

(73) Assignees: Tokyo Electron Limited, Tokyo (JP); Tadahiro Ohmi, Miyagi (JP)

( * ) Notice: Subject to any disclaimer, the term of this patent is extended or adjusted under 35 U.S.C. 154(b) by 64 days.

(21) Appl. No.: 10/473,062

(22) PCT Filed: Mar. 28, 2002

(86) PCT No.: PCT/JP02/03113

§ 371 (c)(1),
(2), (4) Date: Sep. 26, 2003

(87) PCT Pub. No.: WO02/080254

PCT Pub. Date: Oct. 10, 2002

(65) Prior Publication Data
US 2004/0118834 A1 Jun. 24, 2004

(30) Foreign Application Priority Data
Mar. 28, 2001 (JP) .............................. 2001-094277

(51) Int. Cl.
*B23K 10/00* (2006.01)
*B23K 9/00* (2006.01)
(52) U.S. Cl. ..................... 219/121.43; 219/121.41; 219/121.57; 118/723 MW; 204/298.38; 156/345.34; 156/345.41

(58) Field of Classification Search ............. 219/121.4, 219/121.41, 121.43, 121.57; 118/723 MW; 204/298.37, 298.38; 156/345.36, 345.4, 156/345.41, 345.5, 345.34
See application file for complete search history.

(56) References Cited

U.S. PATENT DOCUMENTS

| 4,933,602 A | * | 6/1990 | Ono et al. ..................... 315/39 |
| 5,468,296 A | | 11/1995 | Patrick et al. |
| 6,076,484 A | * | 6/2000 | Matsumoto et al. 118/723 MW |
| 6,150,628 A | | 11/2000 | Smith et al. |
| 2002/0112819 A1 | * | 8/2002 | Kamarehi et al. ..... 156/345.36 |
| 2002/0125226 A1 | * | 9/2002 | Smith et al. ........... 219/121.57 |

(Continued)

FOREIGN PATENT DOCUMENTS

DE 195 32 435 A1 3/1997

(Continued)

OTHER PUBLICATIONS

Supplementary European Search Report of EP 02 70 7230.

Primary Examiner—Mark Paschall
(74) Attorney, Agent, or Firm—Finnegan, Henderson, Farabow, Garrett & Dunner, L.L.P.

(57) ABSTRACT

A microwave plasma processing apparatus is disclosed that enables fast and easy plasma ignition at the pressure for plasma processing In the microwave plasma processing apparatus, a plasma ignition facilitating unit is provided to facilitate plasma ignition induced by a microwave. The plasma ignition facilitating unit includes a deuterium lamp that emits vacuum ultraviolet rays, and a transmission window that allows the vacuum ultraviolet rays to penetrate and irradiate a plasma excitation space. The transmission window is a convex lens, and focuses the vacuum ultraviolet rays to enhance ionization of the plasma excitation gas. With such a configuration, it is possible to induce plasma ignition easily and quickly.

23 Claims, 5 Drawing Sheets

U.S. PATENT DOCUMENTS

2002/0135308 A1* 9/2002 Janos et al. ............. 315/111.21
2003/0051990 A1* 3/2003 Spielman et al. ........ 204/158.2

FOREIGN PATENT DOCUMENTS

| | | |
|---|---|---|
| JP | 63-158798 | 7/1988 |
| JP | 02-151021 | 6/1990 |
| JP | 06-302525 | 10/1994 |
| JP | 06-342768 | 12/1994 |
| JP | 08-022129 | 1/1996 |
| JP | 09-115694 | 5/1997 |
| JP | 10-102251 | 4/1998 |
| JP | 11-111708 | 4/1999 |
| JP | 11-168094 | 6/1999 |

* cited by examiner

MICROWAVE PLASMA PROCESSING APPARATUS, PLASMA IGNITION METHOD, PLASMA FORMING METHOD, AND PLASMA PROCESSING METHOD

TECHNICAL FIELD

The present invention generally relates to a plasma processing apparatus, and particularly, to a plasma processing apparatus that performs plasma processing using plasma excited by a microwave.

BACKGROUND OF THE INVENTION

In recent years and continuing, among plasma processing apparatuses, the microwave plasma processing apparatus is attracting attention. Compared with other plasma processing apparatuses, such as a parallel plate plasma processing apparatus and an ECR plasma processing apparatus, the plasma potential is relatively low in the microwave plasma processing apparatus, enabling generation of plasma having a low electron temperature and low ion energy.

Therefore, with the microwave plasma processing apparatus, it is possible to prevent metal contamination and ion irradiation damage to a substrate subjected to plasma processing. In addition, because a plasma excitation space can be separated from the plasma processing space, it is possible to carry out plasma processing independent of materials of the substrate and patterns formed on the substrate.

In the microwave plasma processing apparatus, a gas for exciting plasma (referred to "plasma excitation gas") is fed into a chamber first, and then the microwave is introduced to the plasma excitation gas to start the generation of plasma (plasma ignition). Because of the high frequency of the microwave, the electrical field of the microwave changes before electrons of the plasma excitation gas are sufficiently accelerated, making plasma ignition difficult. Additionally, in recent plasma processing, a pressure of the plasma excitation gas as low as, for example, 67 Pa (about 0.5 Torr) is sometimes required. Because of the low pressure, the density of the plasma excitation gas is low, further making plasma ignition difficult.

In the microwave plasma processing apparatus, differing from the parallel plate plasma processing apparatus, the microwave is emitted from a microwave antenna, and there is no electrical field applied to the substrate to be processed, therefore, free electron emission or other phenomena causing plasma ignition do not occur, making plasma ignition more difficult.

In the microwave plasma processing apparatus of the related art, usually, the pressure inside the processing chamber is set high at the time of plasma ignition, for example, the pressure is set to 133 Pa (about 1 Torr) so as to induce plasma ignition easily; after the ignition, the pressure is lowered to, for example, 7 Pa (about 50 mTorr). However, in this plasma ignition, an additional control procedure not relevant to the object plasma processing has to be gone through to increase the pressure inside the processing chamber for plasma ignition and to lower the pressure after the plasma ignition, and this lengthens the preparation time before plasma processing starts, and lowers throughput.

DISCLOSURE OF THE INVENTION

Accordingly, a general object of the present invention is to provide a novel and useful microwave plasma processing apparatus, a plasma ignition method, a plasma forming method, and a plasma processing method able to solve one or more problems of the related art.

A more specific object of the present invention is to provide a microwave plasma processing apparatus, a plasma ignition method, a plasma forming method, and a plasma processing method enabling fast and easy plasma ignition at a pressure for plasma processing.

According to an aspect of the present invention, there is provided a microwave plasma processing apparatus that generates plasma by a microwave and carries out plasma processing, comprising a plasma ignition facilitating unit configured to facilitate plasma ignition by the microwave.

According to another aspect of the present invention, there is provided a method of inducing plasma ignition by a microwave, comprising the steps of: evacuating a processing chamber to a predetermined vacuum; supplying a plasma excitation gas to the processing chamber; emitting at least one of vacuum ultraviolet rays, X-rays, a laser beam, an electron beam, and light from an excimer lamp to the plasma excitation gas inside the processing chamber; and introducing the microwave to the plasma excitation gas in the processing chamber to induce plasma ignition.

According to another aspect of the present invention, there is provided a method of forming plasma by radiating a microwave from a microwave antenna, comprising the steps of: evacuating a processing chamber to a predetermined vacuum; supplying a plasma excitation gas to the processing chamber; emitting vacuum ultraviolet rays to the plasma excitation gas inside the processing chamber through a transmission window mounted on the processing chamber; focusing, by the transmission window, the vacuum ultraviolet rays to a predetermined position; ionizing at least a part of the plasma excitation gas; and radiating the microwave into the processing chamber to induce plasma ignition.

According to another aspect of the present invention, there is provided a plasma processing method for processing a substrate using plasma formed by radiating a microwave from a microwave antenna, comprising the steps of: evacuating a processing chamber to a predetermined vacuum; supplying a plasma excitation gas to the processing chamber; emitting vacuum ultraviolet rays to the plasma excitation gas inside the processing chamber through a transmission window mounted on the processing chamber; focusing, by the transmission window, the vacuum ultraviolet rays to a predetermined position; ionizing at least part of the plasma excitation gas; radiating the microwave into the processing chamber to induce plasma ignition; and feeding a process gas for processing the substrate into the processing chamber after the plasma ignition.

According to the present invention, because a plasma ignition facilitating unit is provided to facilitate plasma ignition induced by a microwave, it is possible to induce plasma ignition easily and quickly with only the microwave, even under conditions not favorable to plasma ignition. The plasma ignition facilitating unit may have a configuration in which vacuum ultraviolet rays, x-rays, a laser beam, an electron beam, or light from an excimer lamp is emitted to a plasma excitation space to induce plasma ignition easily. Particularly, it is preferable to use vacuum ultraviolet rays emitted from a deuterium lamp, for example, vacuum ultraviolet rays at a wavelength of 135 nm, to penetrate a transmission window and irradiate the plasma excitation space in the processing chamber. The plasma excitation gas in the plasma excitation space is ionized by the vacuum ultraviolet rays to serve as seeds for generating plasma. As a result, by introducing a microwave, it is possible to generate plasma easily.

BEST MODE FOR CARRYING OUT THE INVENTION

Below, preferred embodiments of the present invention are explained with reference to the accompanying drawings.

Figure 1:
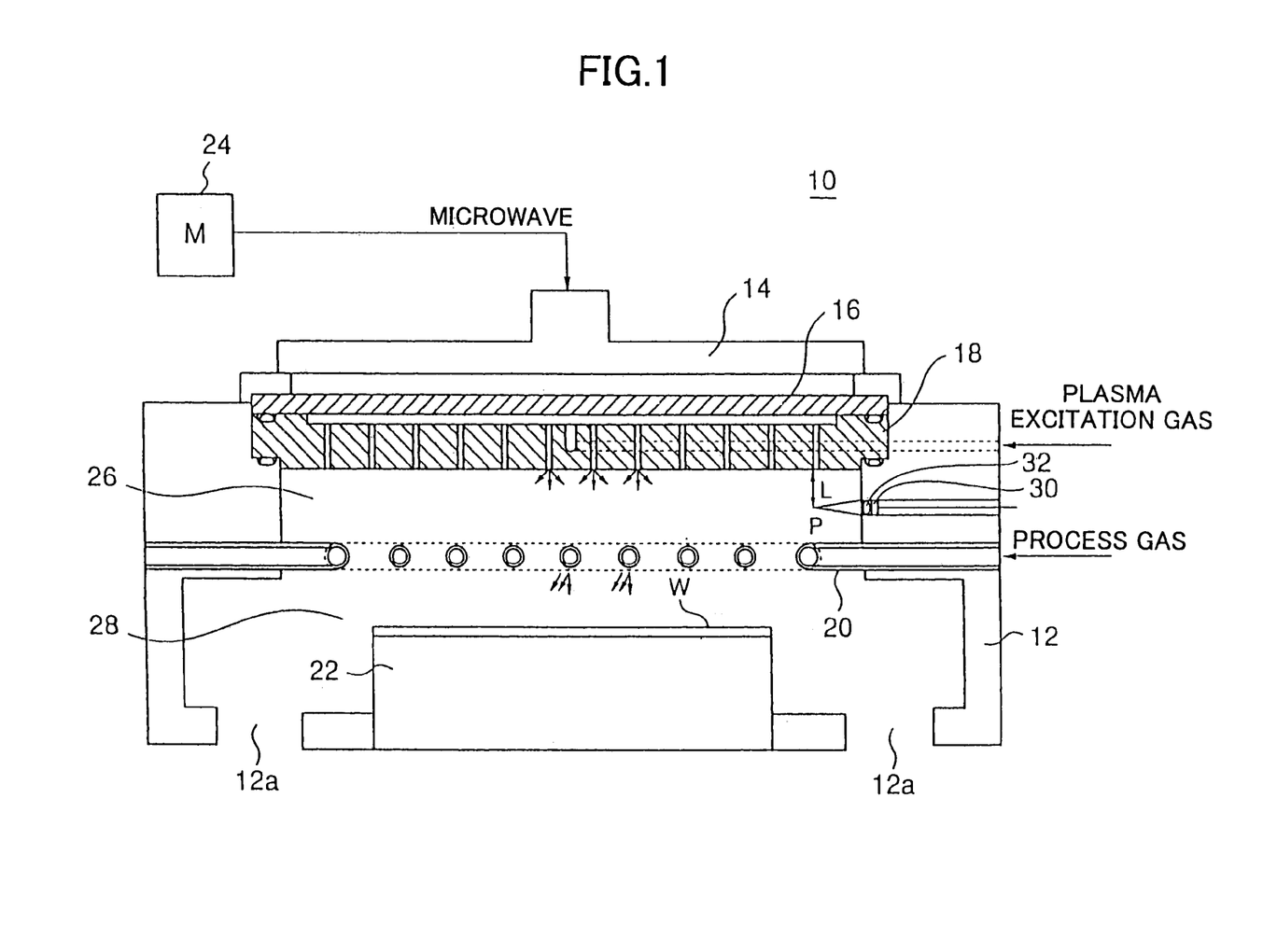
FIG. 1 is a schematic view showing a configuration of a microwave plasma processing apparatus according to an embodiment of the present invention.

FIG. 1 is a schematic view showing a configuration of a microwave plasma processing apparatus according to an embodiment of the present invention.

The microwave plasma processing apparatus 10 includes a processing chamber 12, a slot antenna (microwave antenna) 14 above the processing chamber 12, a dielectric separation wall 16 below the slot antenna 14, a plasma excitation gas shower plate 18 below the dielectric separation wall 16 for feeding a plasma excitation gas, a process gas shower plate 20 below the plasma excitation gas shower plate 18 for feeding a process gas, a stand 22 below the process gas shower plate 20, and a magnetron 24 for generating a microwave.

The microwave generated by the magnetron 24, for example, at 2.45 GHz, is directed to the slot antenna 14 through a wave guide (not illustrated). The microwave directed to the slot antenna 14 passes through the dielectric separation wall 16 and the plasma excitation gas shower plate 18, and is directed to a plasma excitation space 26.

A plasma excitation gas, for example, any noble gas of Argon (Ar), Krypton (Kr), and Xenon (Xe), comes out from the plasma excitation gas shower plate 18 and enters the plasma excitation space 26, where the plasma excitation gas is excited by the microwave and plasma is generated. The plasma generated in the plasma excitation space 26, for example, passes through openings arranged in a lattice manner in the process gas shower plate 20, and is fed to a processing space 28.

From the process gas shower plate 20, a process gas is supplied to the processing space 28. On the stand 22 disposed in the processing space 28, a semiconductor wafer W, such as a silicon wafer, is located to be subjected to plasma processing in the process gas and the plasma. The resulting gas of the plasma processing is exhausted by a not illustrated pump through an exhaust port 12a provided at the bottom of the processing chamber 12.

Next, plasma ignition in the microwave plasma processing apparatus 10 is explained.

In the microwave plasma processing apparatus 10, plasma ignition is induced by the introduced microwave in the plasma excitation space 26. However, if the pressure inside the processing chamber 12 is low, it is difficult to induce plasma ignition with only a microwave. Therefore, in the microwave plasma processing apparatus 10 of the present embodiment, a plasma ignition facilitating unit is provided to assist or facilitate plasma ignition induced by the microwave.

The plasma ignition facilitating unit of the present embodiment includes a deuterium lamp 30 mounted on a side wall of the processing chamber 12 that defines the plasma excitation space 26 and a transmission window 32. The deuterium lamp 30 emits vacuum ultraviolet rays at a wavelength of 135 nm. The vacuum ultraviolet rays pass through the transmission window 32 and are directed to the plasma excitation space 26, where the vacuum ultraviolet rays induce ionization of the plasma excitation gas, and thereby facilitate microwave plasma ignition. It is preferable that the transmission window 32 be made from $CaF_2$, $MgF_2$, LiF and so on so that the vacuum ultraviolet rays at short wavelengths are not absorbed. In addition, because the vacuum ultraviolet rays have a very good ionization efficiency at a pressure around a range from 1.34 Pa (about 0.01 Torr) to 13.4 Pa (about 0.1 Torr), it is preferable to use the vacuum ultraviolet rays in the plasma ignition facilitating unit in the present embodiment.

As described above, since the vacuum ultraviolet rays emitted from the deuterium lamp 30 have short wavelengths and thus high energy, they can efficiently ionize the plasma excitation gas constituted by a noble gas. For example, Krypton (Kr) gas can be used as the plasma excitation gas. The energy necessary to remove an electron from a Krypton atom is 13.8 eV. The energy of a photon of the vacuum ultraviolet rays at a wavelength of 135 nm is 9 eV. Therefore, the Krypton atom receives 18 eV if two such photons are absorbed, making it possible to remove an electron from the Krypton atom.

In other words, when the Krypton gas is irradiated by the vacuum ultraviolet rays at a wavelength of 135 nm, a considerable number of electrons are emitted from the Krypton atoms, inducing ionization of the Krypton gas. If a microwave is introduced to the ionized Krypton gas, it is possible to easily induce plasma ignition.

Here, in order for a Krypton atom to absorb two photons, it is necessary for the incident photons to continuously impact the Krypton atoms, namely, transfer energy to the Krypton atoms continuously, and preferably, the strength of the vacuum ultraviolet rays is high. To increase the strength of the vacuum ultraviolet rays, it is preferable that the transmission window 32 be made into a convex lens to focus the vacuum ultraviolet rays to a specified position in the plasma excitation space 26. Preferably, the focusing position (P) of the vacuum ultraviolet rays is one of the positions where the electric field of the microwave is strongest, for example, at nodes of a stationary wave of the microwave or middle points between two nodes (namely, antinodes of the stationary wave) in the plasma excitation space 26.

In the plasma ignition facilitating unit of the present embodiment, the process gas shower plate 20 is made of conductive materials, and the microwave is reflected by the plasma excitation gas shower plate 18 and the process gas shower plate 20, thereby, the stationary wave of the microwave is to generated between the plasma excitation gas shower plate 18 and the process gas shower plate 20. Therefore, in the present embodiment, a convex lens is selected to be used as the transmission window 32 so that its focal point is located at an antinode of the stationary wave. Namely, the distance L from the plasma excitation gas shower plate 18 to the focal point equals to one-fourth of the wave length λ of the microwave (λ/4).

Consequently, because the high strength vacuum ultraviolet rays focused by the transmission window 32 irradiate a portion of the plasma excitation space 26 where ionization most probably occurs, absorption of two photons by a Krypton atom becomes easy, and this further facilitates plasma ignition. It should be noted that the distance L mentioned above is not limited to one-fourth of the wave length λ of the microwave, but it may be other distances corresponding to other positions of the antinodes of the stationary wave, for example, 3λ/4, 5λ/4, or nλ/4 (where n is an integer).

Figure 2:
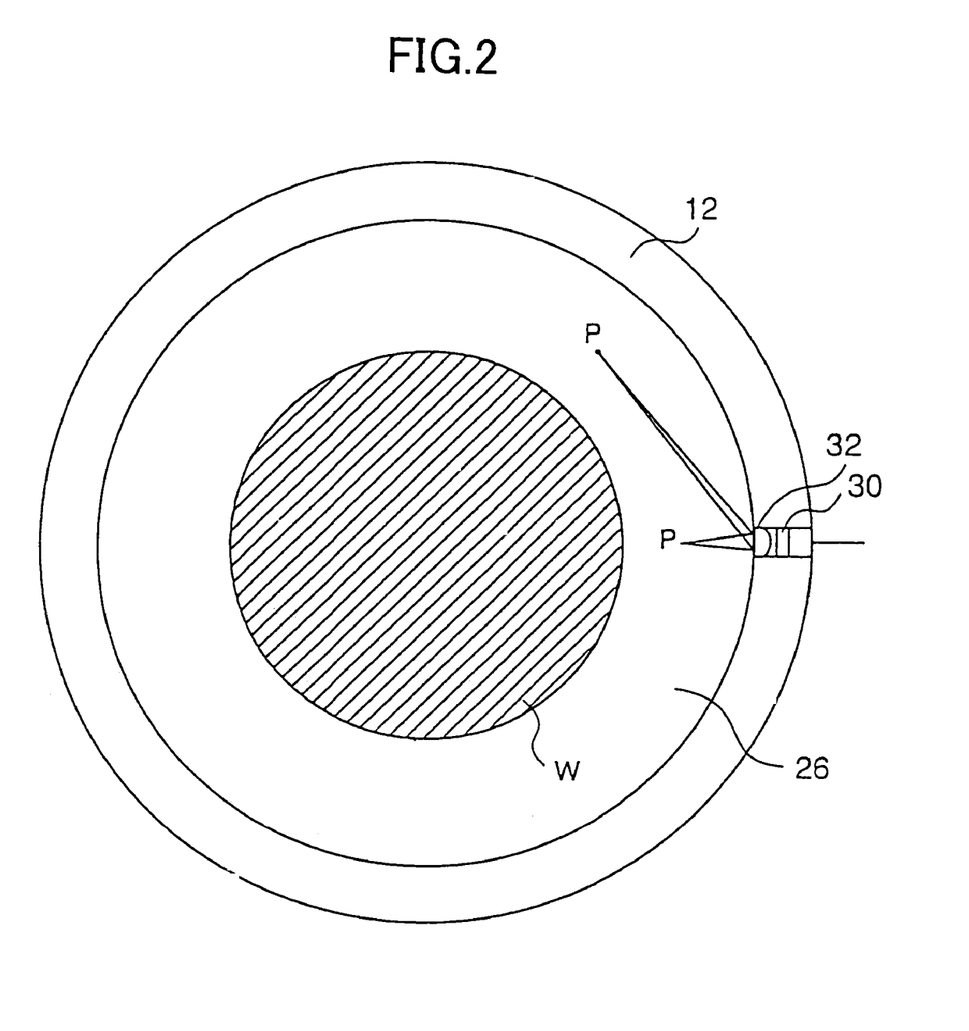
FIG. 2 is a plan view showing the focusing position of the transmission window relative to the semiconductor wafer.

FIG. 2 is a plan view of the plasma excitation space 26 when the semiconductor wafer W is viewed from the top perpendicularly, showing the focusing position of the transmission window 32. Preferably, the position (P) where the vacuum ultraviolet rays are focused, namely, the position of the focusing point of the transmission window 32 (a convex lens), is out of the right cylindrical region with the semiconductor wafer W as a base. Specifically, if the plasma ignition takes place above but close to the semiconductor wafer W, it may result in adverse influence on the semiconductor wafer W because the semiconductor wafer W ends up being on the path for propagating the plasma excitation gas. In order to avoid this, it is preferable that the position of the plasma ignition be out of the right cylindrical region with the semiconductor wafer W as a base. In FIG. 2, the process gas shower plate 20 is not illustrated.

Figure 3:
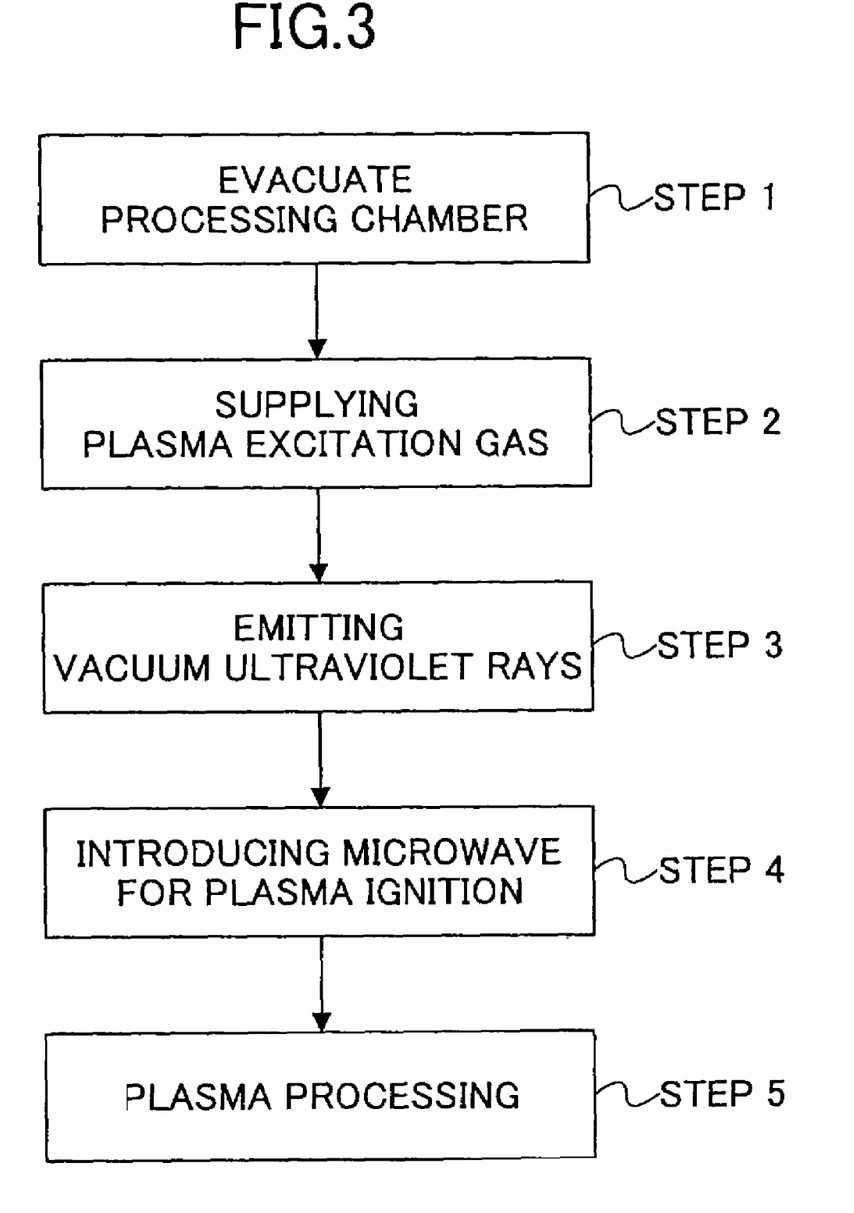
FIG. 3 is a flowchart showing the plasma processing carried out by the microwave plasma processing apparatus shown in FIG. 1.

FIG. 3 is a flowchart showing the plasma processing carried out by the microwave plasma processing apparatus 10 of the present embodiment.

As described above, in the microwave plasma processing apparatus 10 of the present embodiment, first, the processing chamber 12 is evacuated to a predetermined vacuum (step 1). Then, a plasma excitation gas is supplied to the plasma excitation space 26 (step 2). After that, the deuterium lamp 30 emits vacuum ultraviolet rays, and the vacuum ultraviolet rays pass through the transmission window 32 and are directed to the plasma excitation space 26 (step 3). The vacuum ultraviolet rays remove electrons from atoms of the plasma excitation gas, and in this state, a microwave is introduced to the plasma excitation space 26 from the slot antenna 14 to induce plasma ignition (step 4). When plasma ignition is induced, plasma is generated continuously from then on. The thus generated plasma passes through the openings in the process gas shower plate 20, and enters the processing space 28. With the process gas and the plasma, plasma processing is carried out on the semiconductor wafer W (step 5).

For example, in the case of forming one of a silicon dioxide film, a silicon nitride film, and a silicon nitride oxide film on a silicon wafer, at least one of $O_2$, $NH_3$, $N_2$, and $H_2$ may be used as the process gas and supplied to the processing space 28 from the process gas shower plate 20. In the case of etching a silicon wafer, for example, fluorocarbon or halogen gas may be used as the process gas and supplied to the processing space 28 from the process gas shower plate 20.

Here, the process gas is supplied from the process gas shower plate 20 to the processing space 28, which is separated from the plasma excitation space 26, and flows from the wafer W toward the exhaust port 12a provided at the bottom of the processing chamber 12. That is, the process gas cannot enter into the plasma excitation space 26. Therefore, at the time of plasma ignition, the process gas does not exist in the plasma excitation space 26, and this prevents problems caused by dissociation of the process gas at the time of plasma ignition.

While the invention has been described with reference to preferred embodiments, the invention is not limited to these embodiments, but numerous modifications could be made thereto without departing from the basic concept and scope described in the claims.

For example, it is described above that the deuterium lamp 30 and the transmission window 32 are mounted on the side wall of the processing chamber 12, but they can also be mounted at different positions.

Figure 4:
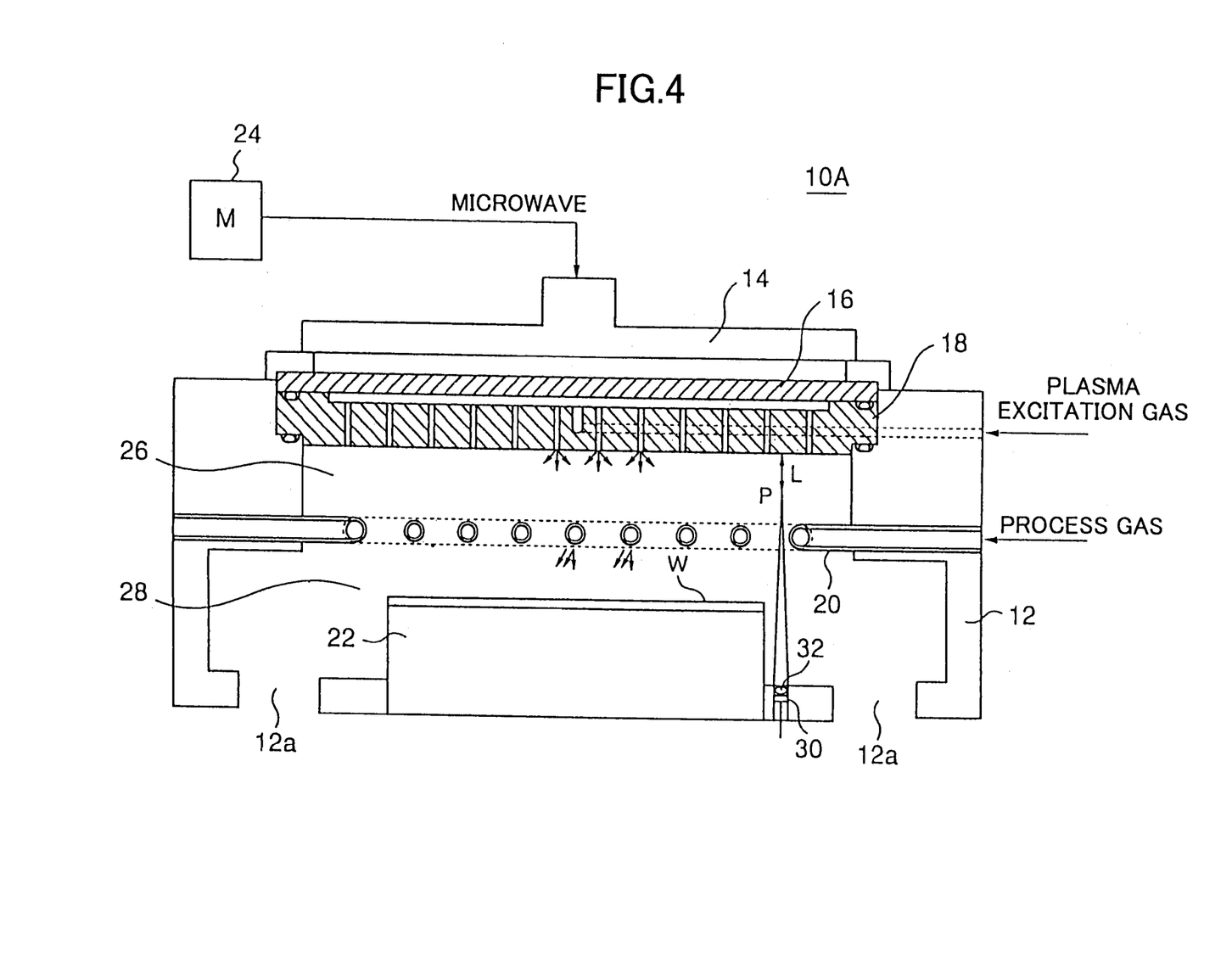
FIG. 4 is a schematic view showing a configuration of a modification to the microwave plasma processing apparatus shown in FIG. 1.

FIG. 4 is a schematic view showing a configuration of a modification to the microwave plasma processing apparatus shown in FIG. 1.

In the microwave plasma processing apparatus 10A shown in FIG. 4, the deuterium lamp 30 and the transmission window 32 are mounted on the bottom of the processing chamber 12. In this case, because the walls defining the plasma excitation space 26 are smooth, it is possible to prevent abnormal microwave discharge caused by a discontinuity of the walls defining the plasma excitation space 26.

Figure 5:
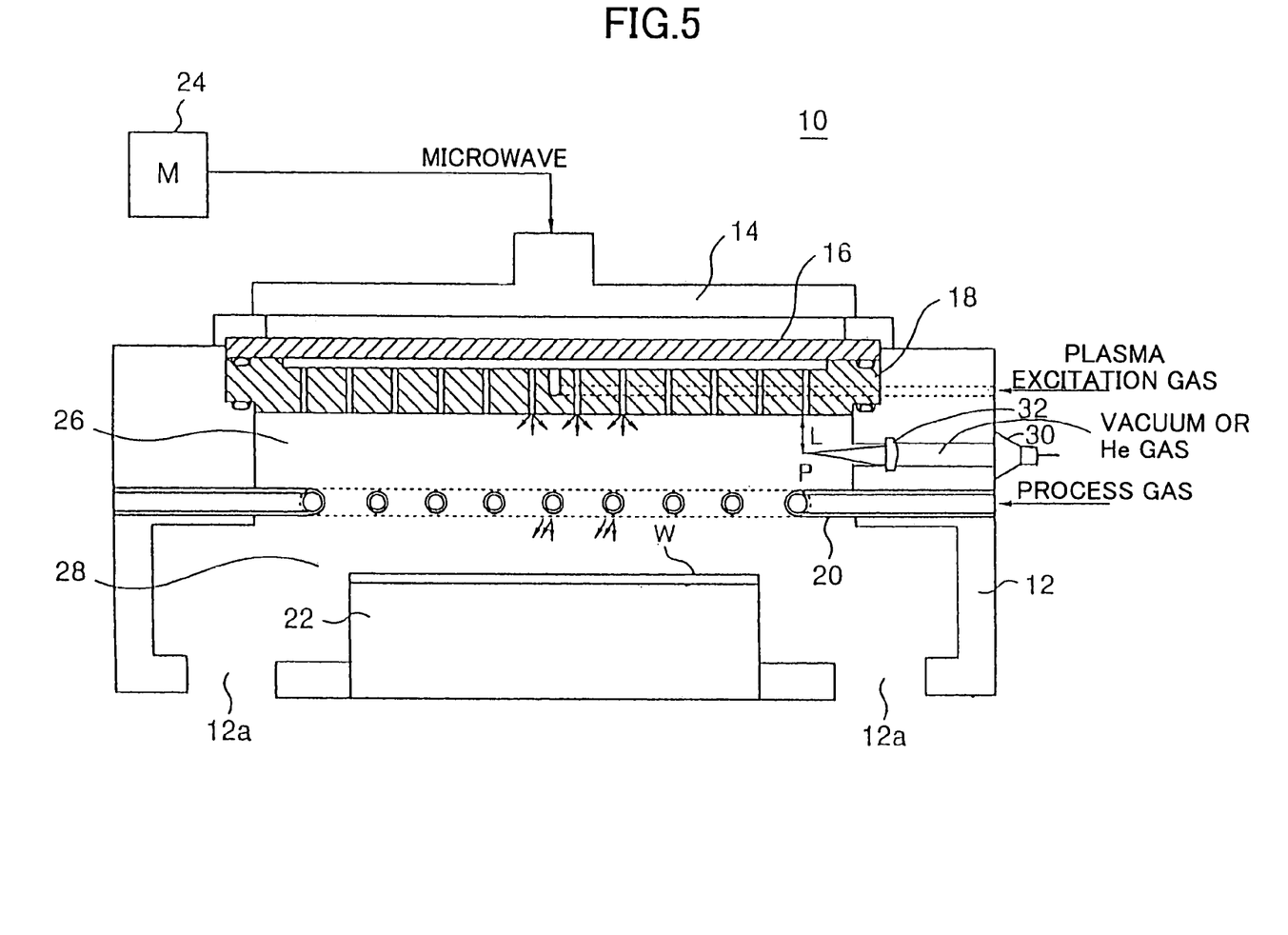
FIG. 5 is a schematic view showing a configuration of another modification to the microwave plasma processing apparatus shown in FIG. 1.

FIG. 5 is a schematic view showing a configuration of another modification to the microwave plasma processing apparatus shown in FIG. 1.

As shown in FIG. 5, the deuterium lamp 30 is mounted on the outer side of the processing chamber 12, and the space between the deuterium lamp 30 and the transmission window 32 (the space that the vacuum ultraviolet rays pass through) is maintained to be in a vacuum, because otherwise the 135 nm vacuum ultraviolet rays emitted from the deuterium lamp 30 are absorbed in the air. Alternatively, the space between the deuterium lamp 30 and the transmission window 32 may be filled with a helium gas.

In addition, the deuterium lamp 30 may have a reflector to condense the vacuum ultraviolet rays emitted from the deuterium lamp 30 in various directions. In this case, it is not necessary to make the transmission window 32 a convex lens; for example, a planar transmission window 32 is sufficient.

Further, it is described above that the plasma ignition facilitating unit is configured to emit the vacuum ultraviolet rays, but the present invention is not limited to this. The present invention is applicable to any other configuration provided that ionization of the plasma excitation gas is enabled. For example, instead of the vacuum ultraviolet rays, X-rays, a laser beam, an electron beam, or light from an excimer lamp may be used to ionize the plasma excitation gas.

INDUSTRIAL APPLICABILITY

According to the present invention, because a plasma ignition facilitating unit is provided to facilitate plasma ignition induced by a microwave, it is possible to induce plasma ignition easily and quickly with the microwave only, even under conditions not favorable to plasma ignition. The plasma ignition facilitating unit may have a configuration in which the vacuum ultraviolet rays from a deuterium lamp penetrate a transmission window and irradiate a plasma excitation space in a processing chamber; thereby, it is possible to facilitate plasma ignition with a simple configuration.

The invention claimed is:

1. A microwave plasma processing apparatus that generates plasma by a microwave and carries out plasma processing, comprising:
   a processing chamber;
   a process gas shower plate disposed within the processing chamber;
   a microwave antenna disposed adjacent the processing chamber;

a dielectric separation wall mounted proximal the microwave antenna to facilitate microwave transmission;

a plasma excitation gas shower plate disposed adjacent the dielectric separation wall; and a plasma ignition facilitating unit configured to facilitate plasma ignition by the microwave.

2. The microwave plasma processing apparatus according to claim 1, wherein the microwave used for generation of the plasma is directed into the processing chamber from the microwave antenna through the dielectric separation wall.

3. The microwave plasma processing apparatus according to claim 1, wherein the plasma ignition facilitating unit emits at least one of vacuum ultraviolet rays, X-rays, a laser beam, an electron beam, and light from an excimer lamp to a plasma excitation space to induce the plasma ignition.

4. The microwave plasma processing apparatus according to claim 3, wherein the plasma ignition facilitating unit comprising:

a deuterium lamp that emits the vacuum ultraviolet rays; and a transmission window that directs the vacuum ultraviolet rays passing therethrough to the plasma excitation space.

5. The microwave plasma processing apparatus according to claim 4, wherein a space between the deuterium lamp and the transmission window is maintain to be at a vacuum.

6. The microwave plasma processing apparatus according to claim 4, wherein a space between the deuterium lamp and the transmission window is filled with a helium gas.

7. The microwave plasma processing apparatus according to claim 4, wherein the deuterium lamp and the transmission window are mounted on a side wall of the plasma excitation space defined by the processing chamber.

8. The microwave plasma processing apparatus according to claim 4, wherein the deuterium lamp and the transmission window are mounted on a bottom of the processing chamber defining the processing space.

9. The microwave plasma processing apparatus according to claim 4, wherein the transmission window includes a convex lens having a focal point at a predetermined position disposed in the plasma excitation space.

10. The microwave plasma processing apparatus according to claim 9, wherein the predetermined position is out of a space disposed between the process gas shower plate and the plasma excitation gas shower plate proximal a substrate to be processed.

11. The microwave plasma processing apparatus according to claim 9, wherein at the predetermined position, an electric field of the microwave radiated inside the processing chamber is a maximum.

12. The microwave plasma processing apparatus according to claim 9, wherein a distance from the predetermined position to a surface of the plasma excitation gas shower plate for feeding the plasma excitation gas into the plasma excitation space is a multiple of $\lambda/4$, where $\lambda$ is the wave length of the microwave.

13. The microwave plasma processing apparatus according to claim 4, wherein the transmission window is formed from one of $CaF_2$, $MgF_2$, and $LiF$.

14. The microwave plasma processing apparatus according to claim 3, wherein the plasma excitation space is defined by a plasma excitation gas shower plate disposed in the processing chamber and a process gas shower plate disposed in the processing chamber, and wherein the plasma excitation space is separated from a processing space by a process gas shower plate, and a process gas is supplied from the process gas shower plate to the processing space thereby preventing the process gas from entering into the plasma excitation space.

15. A method of inducing plasma ignition by a microwave, comprising the steps of:

evacuating a processing chamber to a predetermined vacuum;

supplying a plasma excitation gas to the processing chamber;

emitting at least one of vacuum ultraviolet rays, X-rays, a laser beam, an electron beam, and light from an excimer lamp to the plasma excitation gas inside the processing chamber;

introducing the microwave through a microwave antenna to the plasma excitation gas in the processing chamber; and reflecting the microwave between a plasma excitation gas shower plate and a process gas shower plate, thereby generating a stationary wave of the microwave to induce plasma ignition.

16. A method of forming plasma by radiating a microwave from a microwave antenna, comprising the steps of:

evacuating a processing chamber to a predetermined vacuum;

supplying a plasma excitation gas to the processing chamber;

emitting vacuum ultraviolet rays to the plasma excitation gas inside the processing chamber through a transmission window mounted on the processing chamber;

focusing, by the transmission window, the vacuum ultraviolet rays to a predetermined position;

ionizing at least a part of the plasma excitation gas;

radiating the microwave into the processing chamber; and reflecting the microwave between a plasma excitation gas shower plate and a process gas shower plate, thereby generating a stationary wave of the microwave to induce plasma ignition.

17. A plasma processing method for processing a substrate using plasma formed by radiating a microwave from a microwave antenna, comprising the steps of:

evacuating a processing chamber to a predetermined vacuum;

supplying a plasma excitation gas to the evacuated processing chamber;

emitting vacuum ultraviolet rays to the plasma excitation gas inside the processing chamber through a transmission window mounted on the processing chamber;

focusing, by the transmission window, the vacuum ultraviolet rays to a predetermined position;

ionizing at least a part of the plasma excitation gas;

radiating the microwave into the processing chamber;

reflecting the microwave between a plasma excitation gas shower plate and a process gas shower plate, thereby generating a stationary wave of the microwave to induce plasma ignition; and feeding a process gas for processing the substrate into the processing chamber after the plasma ignition.

18. The plasma processing method according to claim 17, wherein the plasma excitation gas comprising a noble gas including one of Argon (Ar), Krypton (Kr), and Xenon (Xe).

19. The plasma processing method according to claim 17, wherein the process gas includes at least one of $O_2$, $NH_3$, $N_2$, and $H_2$.

20. The plasma processing method according to claim 19, wherein the substrate is a silicon wafer, and the process gas is fed into the processing space to form at least one of a silicon dioxide film, a silicon nitride film, and a silicon nitride oxide film on the silicon wafer.

21. The plasma processing method according to claim 17, wherein the process gas includes at least one of a fluorocarbon gas and a halogen gas.

22. The plasma processing method according to claim 21, wherein the process gas is fed into the processing space to etch the substrate.

23. The plasma processing method according to claim 17, wherein the plasma excitation gas is supplied to a plasma excitation space separated from a processing space in which the substrate is located, and the process gas is supplied to the processing space thereby preventing the process gas from entering into the plasma excitation space at the time of plasma ignition.

* * * * *